United States Patent [19]

Sakai et al.

[11] Patent Number: 4,698,730
[45] Date of Patent: Oct. 6, 1987

[54] LIGHT-EMITTING DIODE

[75] Inventors: Hirou Sakai, Atsugi; Toshihide Kawamura, Yono, both of Japan

[73] Assignee: Stanley Electric Co., Ltd., Tokyo, Japan

[21] Appl. No.: 892,503

[22] Filed: Aug. 1, 1986

[51] Int. Cl.$^4$ .............................................. F21V 3/00
[52] U.S. Cl. .................................. 362/311; 362/339; 362/800; 313/110
[58] Field of Search ............... 362/311, 800, 320, 339, 362/62, 80; 313/110-114

[56] References Cited

U.S. PATENT DOCUMENTS

| | | | |
|---|---|---|---|
| 2,362,176 | 11/1944 | Swanson | 313/110 |
| 4,013,915 | 3/1977 | Dufft | 362/800 |
| 4,228,490 | 10/1980 | Thillays | 362/311 |

FOREIGN PATENT DOCUMENTS

| | | | |
|---|---|---|---|
| 1539564 | 12/1969 | Fed. Rep. of Germany | 313/110 |
| 2733937 | 2/1979 | Fed. Rep. of Germany | 362/311 |
| 7714176 | 12/1977 | Netherlands | 362/800 |

Primary Examiner—James C. Yeung
Attorney, Agent, or Firm—Frishauf, Holtz, Goodman & Woodward

[57] ABSTRACT

A light-emitting element of a light-emitting diode is mounted on a lead frame, stem or substrate, and is molded with resin so as to form a lens portion. A cap made of a light-transparent resin and having a hollow portion at the center thereof and an outer pheripheral surface, is mounted on the lens portion with the lens portion in the hollow portion thereof. The outer pheripheral surface is formed approximately as a parabolic surface so as to reflect side directed light emitted from said light-emitting element toward an illumination output portion of the light-emitting diode. The lens portion and the cap may be integrally molded as one piece.

35 Claims, 9 Drawing Figures

LIGHT-EMITTING DIODE

BACKGROUND OF THE INVENTION

1. Field of the Invention

The present invention relates to a light-emitting diode for emitting a visual light or an infrared light, and which may be used for vehicle lamps, indication lamps, light communication apparatus and sensors, and as a light source.

2. Description of the Prior Art

A known light-emitting diode of this type is shown in FIG. 7. In the known light-emitting diode, reference numeral 1 denotes a light-emitting element of the GaP or GaAsP type. The light-emitting element 1 is mounted in a recess portion 2a of one lead frame 2 and is connected to the other lead frame 3 by a wire 4 using a bonding method. Then, the light-emitting element and the lead frames are integrally molded with resin and there is provided a positive lens portion 5. The front end of the lens portion 5, i.e., the end surface 5a from which light is emitted, is formed in a spherical configuration in order to obtain a parallel light bundle of light rays along an optical axis X.

In the light-emitting diode of FIG. 7, the angular region over which the light emitted from the light-emitting element 1 can be parallel on the spherical end surface 5a, is $\theta_1$, about 60°. A reflective plating is provided at the inner surface of the recess portion 2a of the lead frame 2. Therefore, the light emitted from the light-emitting element 1 to the side direction is reflected to the forward direction, as shown in FIG. 8. In FIG. 8, the solid line shows the light emitted from the center of the light-emitting element 1, while the dash line shows the light emitted from the side of the light emitting element 1. The light within the region $\theta_2$ (about 20°) can be reflected in the forward direction, thereby providing an effective light for illumination. Therefore, the angular region for providing the effective light directed forwardly is, as a whole, $\theta_1 + 2\theta_2$. The other angular region $\theta_3$ (about 40°) is never used to provide effective light.

Referring to FIG. 9, a directivity characteristic of the light-emitting element of GaP and GaAsP types is shown as the curve 6. The region in which effective light can be obtained is within the angle $\theta_1$, over which the light emitted from the light-emitting element 1 is directed in the forward direction and the angle $\theta_2$, over which the light emitted from the light-emitting element 1 is in the side direction. However, the luminance from the angular region $\theta_2$ is extremely small. Therefore, even if the light within the angular region $\theta_2$ is effectively utilized for illumination, it is not expected to make the illumination increase substantially. A reflection at the recess portion 2a in FIG. 8 is considered in that the diameter of the aperture of the recess portion 2a is about three to five times as large as that of the light-emitting element 1. Further, the light-emitting element 1 usually emits a light from the entirety of light-emitting element 1. Therefore, the light-emitting element 1 is not considered as a point light source. Thus, the light reflected from the recess portion 2a is in actuality directed almost to the ineffective direction. Therefore, even if the reflection surface of the recess portion 2a is utilized, the light reflected from the recess portion 2a is relatively little. Furthermore, the light emitted from the light-emitting element 1 within the angular region $\theta_3$ having a high luminance is not utilized at all. Therefore, the construction of FIG. 7 is not expected to increase substantially the illumination of the light-emitting diode on the whole.

OBJECTS OF THE INVENTION

A main object of the present invention is to provide a light-emitting diode in which light emitted therefrom can be used with good utilization and in which the light illumination can be increased, as compared to the conventional light-emitting diode.

Another object of the present invention is to provide a light-emitting diode in which a reflecting portion is integrally mounted on the light-emitting diode per se, thereby increasing the illumination efficiency.

SUMMARY OF THE INVENTION

According to the present invention, a light-emitting diode comprises a light-emitting element which may be mounted, for example, on a lead frame, stem or substrate, and is molded with resin so as to form a lens portion. A cap made of light-transparent resin and having a hollow portion at the center thereof and a peripheral surface, is mounted on the lens portion of the light-emitting diode, and the peripheral surface of the cap formed into approximately a parabolic surface so as to reflect forwardly the light emitted from the light-emitting element. By providing the cap, the light emitted from the side portion of the light-emitting element is reflected to the forward direction as a parallel light, thereby utilizing all of the reflected light as an effective light and remarkably increasing the luminance of the light-emitting diode.

Furthermore, the present invention provides a light-emitting diode comprising a light-emitting element which may be mounted, for example on a lead frame, stem or substrate, and is molded with resin so as to form a positive lens portion at the upper and central portion of the molded body. A parallel-light fetching portion formed with the positive lens portion as a body and surrounding the lens portion, has approximately a parabolic surface disposed at the periphery portion of the parallel-light fetching portion for reflecting the light emitted from the side portion in the side direction. By forming the parallel-light fetching portion as a body together with and around the positive lens portion, as is similar to the above-mentioned light-emitting diode, the light emitted from the side portion of the light-emitting element is reflected to the forward direction as a parallel light, thereby utilizing all of the reflected light as an effective light and remarkably increasing the luminance of the light-emitting diode.

DETAILED DESCRIPTION

Figure 1:
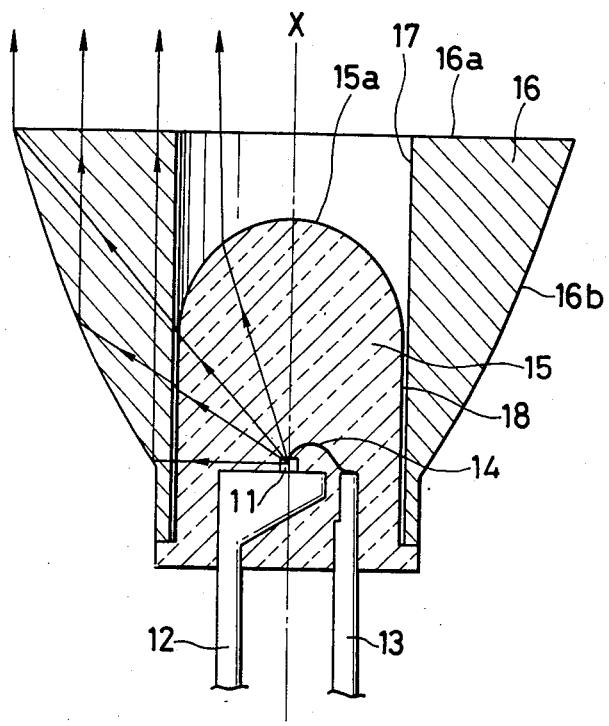
FIG. 1 is a sectional view of a light-emitting diode according to a first embodiment of the present invention.
Figure 2:
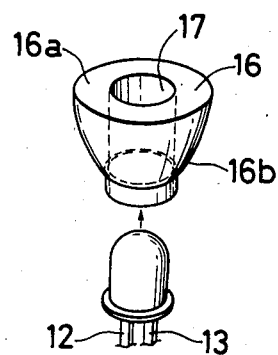
FIG. 2 is a perspective view showing the light-emitting diode of FIG. 1 and a cap separated from the light-emitting diode.
Figure 3:
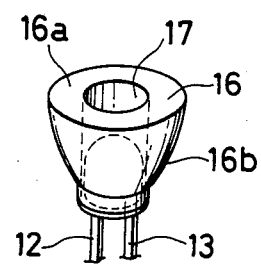
FIG. 3 is a perspective view showing the light-emitting diode in which the cap is fitted.

Referring to FIGS. 1 to 3 a first embodiment of the present invention will be explained hereinafter. In FIGS. 1-3, reference numeral 11 denotes a light-emitting element of the GaP or GaAsP type. The light-emitting element 11 is mounted at the top portion of one lead frame 12 and is electrically connected to the other lead frame 13 through a wire 14 by using a bonding method. The upper portion of the light-emitting element 11 and both lead frames 12 are molded with a light-transparent resin to a lens portion 15 having a spherical end surface at the end portion 15a from which the light emitted from the light-emitting element 11 is emitted. The above-mentioned constitution is similar to a conventional light-emitting diode.

A cap 16 to be fitted to the above-described light-emitting diode is made of the same material as the lens portion 15 or of a light-transparent material such as glass. The cap 16 is formed in a cup-like configuration having a planar upper surface 16a and a central hollow portion 17 into which the lens portion 15 is inserted or fitted. End portion 15a and upper surface 16a together comprise an illumination output portion of the light-emitting diode. As seen in FIG. 1, the inner diameter of the hollow portion 17 is set to be slightly larger than the outer diameter of the lens portion 15, thereby providing a gap 18 therebetween in order to prevent the lens portion 15 from damage when the lens portion 15 is fitted into the hollow portion 17. The peripheral surface 16b of the cap 16 is formed in a parabolic curve having a focal point at the light-emitting element 11. Therefore, all of the light emitted from the light-emitting element 11 and not directed to the end surface 15a is reflected by the cap 16 to the forward direction approximately in parallel with the optical axis X. Though there is provided a slight gap 18 between the lens portion 15 and the cap 16, a refraction or an optical loss due to the air gap 18 is slight, so that the direction of the reflected light is not changed.

Figure 4:
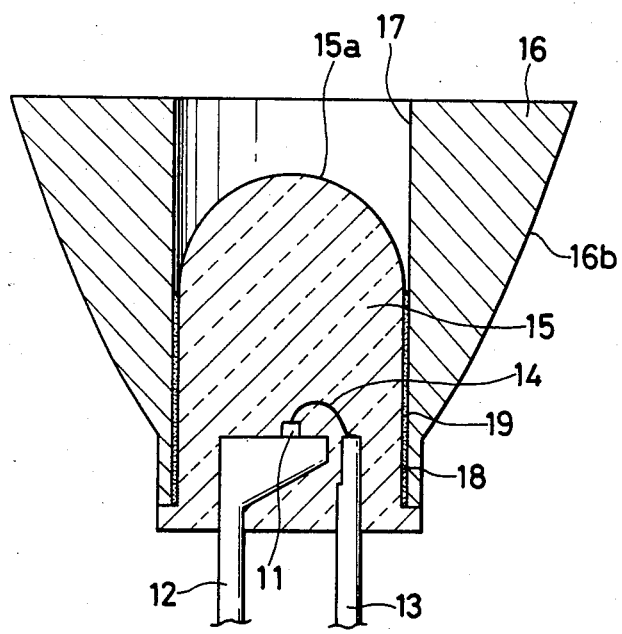
FIG. 4 is a sectional view showing a light-emitting diode according to a second embodiment of the present invention.

Referring next to FIG. 4 a second embodiment of the present invention will be explained hereinafter. Different from the first embodiment mentioned above, the refraction and the optical loss due to the air gap 18 (see FIG. 1) between the lens portion 15 and the cap 16 is eliminated in the second embodiment. In FIG. 4, the same reference numerals are used for the same elements as in the first embodiment, and their explanation is omitted.

In this second embodiment, a light-transparent resin 19 is filled into the air gap 18 between the lens portion 15 and the cap 16, and is hardened. By filling the resin 19 in to the air gap 18, the air layer between the lens portion 15 and the cap 16 is eliminated, thereby eliminating the light refraction and the optical loss due to gap 18 and making stable the connection between the lens portion 15 and the cap 16. In this case, as the resin 19, a similar material to that of the lens portion 15 is selected, having a similar index of refraction. The peripheral surface 16b of the cap 16 is formed in a parabolic curve. Therefore, all of the light emitted from the light-emitting element 11 in the side direction is reflected to the forward direction by cap 16 as effective light.

Figure 5:
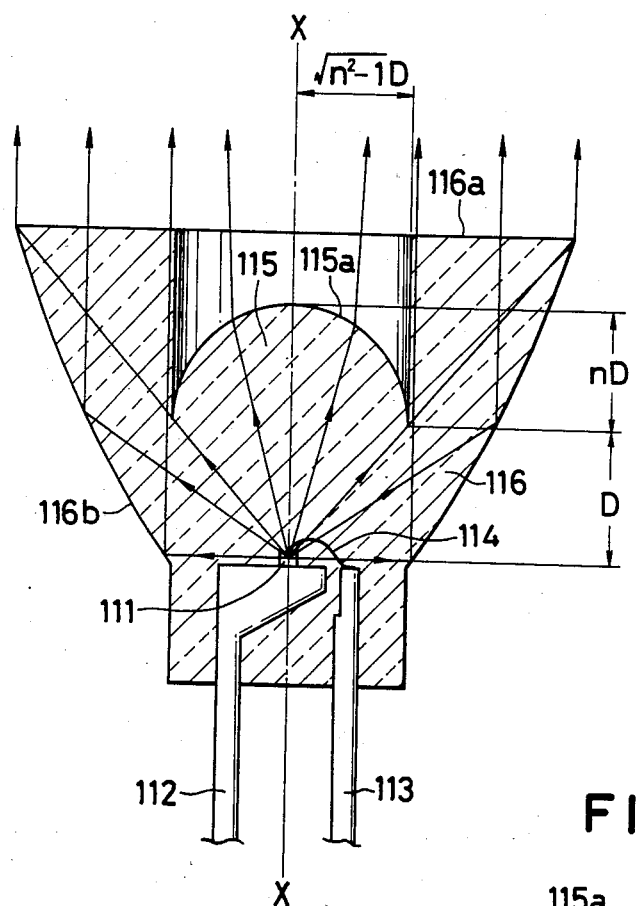
FIG. 5 is a sectional view showing the light-emitting diode according to a third embodiment of the present invention.
Figure 6:
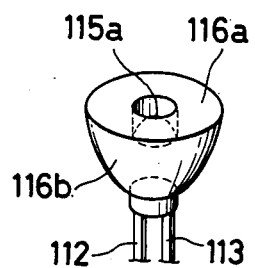
FIG. 6 is a perspective view showing the light-emitting diode of FIG. 5.
Figure 7:
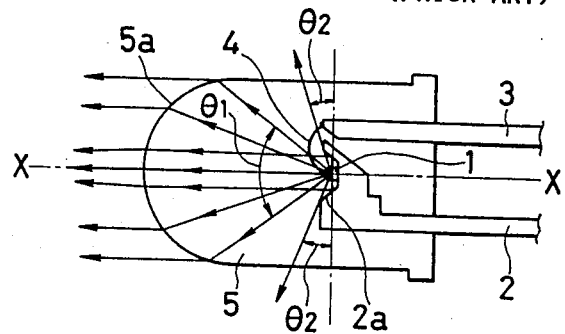
FIG. 7 is a schematic sectional view showing a conventional light-emitting diode.
Figure 8:
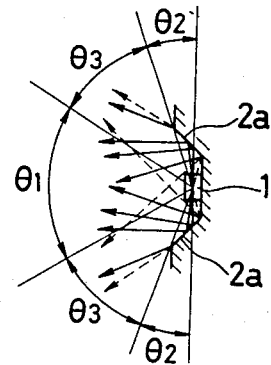
FIG. 8 is a schematic and enlarged view showing the main portion of the conventional light-emitting diode.
Figure 9:
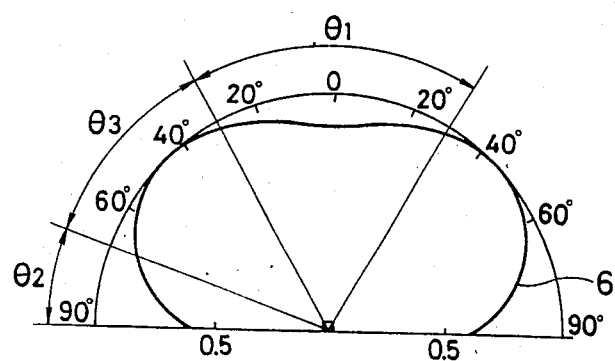
FIG. 9 is a graph showing a directivity characteristic of the light-emitting element.

Referring next to FIGS. 5 and 6, a third embodiment of the present invention will be explained hereinafter. In the embodiment of FIGS. 5 and 6, reference numeral 111 denotes a light-emitting element of GaP or GaAsP type. The light-emitting element 111 is mounted on the top portion of one lead frame 112 and is electrically connected to the other frame 113 through a wire 114 by using a bonding method. The upper portion of the light-emitting element 111 and both lead frames 112 and 113 thus connected, is molded with a light-transparent resin and there is formed a positive lens portion 115 having a spherical end surface at the end portion 115a from which the light emitted from the light-emitting element 111 is emitted.

A parallel-light fetching portion 116 surrounding the positive lens portion 115 is formed in a body together with the lens portion 115. The parallel-light fetching portion 116 is formed in a cup-like shape as a whole, and has a planar upper surface 116a and a peripheral curved surface 116b. The peripheral curved surface 116b is formed in an approximately parabolic curve having a focal point at the position of the light-emitting element 111. Therefore, all of the light emitted from the light-emitting element 111 in the side direction and not directed to the end surface 115a of the positive lens portion 115, is directed to the forward direction by portion 116 approximately in parallel to the optical axis X.

In order to obtain an effective parallel light from the light-emitting diode thus arranged, the formation and dimension of the positive lens portion 115 is designed to such a rotary elliptical configuration that the long diameter and the short diameter are set to 2nD and $2\sqrt{n^2-1} \cdot D$ respectively, where the refractive index of the light-transparent resin is set to n and the distance between the center of the light-emitting element 111 and the vertex of the positive lens portion 115 is set to (n+1) D. The peripheral surface 116b of the parallel-light fetching portion 116 is formed as a rotary parabolic surface having a focal point at the center of the light-emitting element 111.

Since the peripheral surface 116b of the parallel-light fetching portion 116 is formed in a parabolic curve, all of the light emitted from the light-emitting element 111 in the side direction is reflected to the forward direction to provide light effective for illumination.

In each embodiment of the invention, though the light-emitting element is mounted on the lead frame, the present invention should not be limited to such a construction. The light-emitting element may be mounted on a stem or substrate.

As mentioned above, according to the light-emitting diode of the present invention, the cap 16 mounted on the lens portion 15 has a hollow portion 17 at the center thereof and a peripheral surface 16b formed in a parabolic curve having a focal point at the light-emitting element. Alternatively there is formed a positive lens portion 115 at the central portion, and a parallel-light fetching portion 116 surrounding the positive lens portion 115 formed in a body with lens portion 115, the peripheral surface of the parallel-light fetching portion being formed in a parabolic curve having its focal point at the light-emitting element. Therefore, all of the light emitted from the light-emitting element except for the light directed to the lens portion of the light-emitting diode or the lens surface of the positive lens portion, is reflected by the cap 16 or the parallel-light fetching surface in the forward direction in parallel with the optical axis, thereby increasing the effective light bundle and remarkably increasing the illumination provided by the light-emitting diode.

Furthermore, by filling and hardening a light-transparent resin 19 in the air gap 18 located between the lens portion 15 and the cap 16 fitted to the lens portion, as shown in FIG. 4, not only the optical loss due to the air gap is completely eliminated but also the cap is stably fitted to the lens portion.

What is claimed is:

1. A light-emitting diode, comprising:
    a light-emitting element;
    means for coupling said light-emitting element to a source of electrical power;
    a resin lens portion molded around said light-emitting element and including means for directing light emitted by said light-emitting element toward an illumination output portion of said light-emitting diode; and
    cap means made of a light-transparent resin and having side walls defining a hollow portion substantially at the center of said cap means and extending away from the illumination output portion of said light emitting diode, said side walls having an outer peripheral surface, said cap means being coupled to said lens portion of said light-emitting diode with said lens portion being arranged in said hollow portion;
    said outer peripheral surface of said cap means walls being formed into approximately a parabolic surface and including means to reflect side-directed light emitted from said light-emitting element toward said illumination output portion of said light-emitting diode.

2. The light-emitting diode of claim 1 wherein a gap is provided between said lens portion and an inner surface of said cap means walls, and a light-transparent liquid resin is filled in said gap and hardened.

3. The light-emitting diode of claim 1, wherein said outer peripheral surface of said cap means is formed in a rotary parabolic curve having a focal point at said light-emitting element.

4. The light-emitting diode of claim 1, wherein said illumination output portion comprises said directing means of the lens portion, and an end surface portion of said cap means walls.

5. The light-emitting diode of claim 4, wherein said end light-emitting portion of said cap means walls comprises a substantially planar surface perpendicular to an axis of said cap means.

6. The light-emitting diode of claim 5, wherein said directing means of said lens portion comprises a substantially spherical end surface portion thereof.

7. The light-emitting diode of claim 4, wherein said directing means of said lens portion comprises a substantially spherical end surface portion thereof.

8. The light-emitting diode of claim 1, wherein said light-emitting element is mounted on one of a lead frame, a stem and a substrate.

9. The light-emitting diode of claim 1, wherein said light-emitting element is mounted to a lead frame, and is electrically connected to a second lead frame, said lead frames comprising said means for coupling said light-emitting element to a source of electrical power.

10. The light-emitting diode of claim 1, wherein said light-emitting element is mounted on a substantially flat surface portion in said light-emitting diode.

11. The light-emitting diode of claim 1, wherein said cap means extends from the vicinity of said light-emitting element to said illumination output portion of said light-emitting diode.

12. The light-emitting diode of claim 11, wherein said cap means is longer than said lens portion in the longitudinal direction of said light-emitting diode, whereby said lens portion is recessed in said hollow portion of said cap means.

13. The light-emitting diode of claim 1, wherein said directing means of said lens portion directs light emitted by said light-emitting element substantially parallel to an axis of said cap means.

14. The light-emitting diode of claim 13, wherein said reflecting means of the cap means walls directs light emitted by said light-emitting element substantially parallel to an axis of said cap means.

15. The light-emitting diode of claim 1, wherein said reflecting means of the cap means walls directs light emitted by said light-emitting element substantially parallel to an axis of said cap means.

16. The light-emitting diode of claim 1, wherein said lens portion comprises a cylindrical portion with said directing means comprising a rotary arcuate end, the cylindrical portion having its axis parallel to an axis of said cap means, and wherein said cap means walls include a cylindrical inner surface defining said hollow portion, said inner walls of the cpa means being in close proximity to and surrounding the cylindrical portion of the lens portion.

17. The light-emitting diode of claim 1, wherein said light-emitting element has a hemispherical light directivity, the axis of said hemisphere being parallel to an axis of said cap means.

18. The light-emitting diode of claim 17, wherein the axis of said hemisphere is parallel to an axis of the parabolic surface of said cap means.

19. The light-emitting diode of claim 18, wherein the directing means of said lens portion comprises a rotary arcuate end having an axis parallel to the axis of said hemisphere.

20. The light-emitting diode of claim 19, wherein the axes of said hemisphere, rotary arcuate end and parabolic surface are substantially coincident.

21. The light-emitting diode of claim 1, wherein the resin lens portion and the cap means are integral to each other.

22. The light-emitting diode of claim 1, wherein said directing means and said reflecting means direct substantially parallel light rays toward the illumination output portion of the light-emitting diode.

23. The light-emitting diode of claim 22, wherein said directing means and said reflecting means direct only substantially parallel light rays toward the illumination output portion of the light-emitting diode.

24. A light-emitting diode, comprising:
    a light-emitting element;
    means for coupling said light-emitting element to a source of electrical power;
    a resin lens portion molded around said light-emitting element and including means for directing light emitted by said light-emitting element toward an illumination output portion of said light-emitting diode; and a parallel-light fetching portion made of a light-transparent resin and surrounding said lens portion, said parallel-light fetching portion being formed in a single body together with said lens portion, said parallel-light fetching portion having an outer peripheral surface;

said outer peripheral surface of said parallel-light fetching portion surrounding said lens portion and said light-emitting element and being formed into approximately a parabolic surface so as to reflect side directed light emitted from said light-emitting element toward said illumination output portion of said light-emitting diode.

25. The light-emitting diode of claim 24, wherein said lens portion is formed in a rotary elliptical configuration, and said parabolic surface of said parallel-light fetching portion is formed in a rotary parabolic curve having a focal point at said light-emitting element.

26. The light-emitting diode of claim 24, wherein said outer peripheral surface of said parallel-light fetching means is formed in a rotary parabolic curve having a focal point at said light-emitting element.

27. The light-emitting diode of claim 24, wherein said illumination output portion comprises an end light-emitting portion of said lens portion, and an end surface portion of said parallel-light fetching means 28. The light-emitting diode of claim 27, wherein said end light-emitting portion of said parallel-light fetching means comprises a substantially planar surface.

29. The light-emitting diode of claim 28, wherein said light-emitting portion of said lens portion comprises a substantially spherical end surface portion thereof.

30. The light-emitting diode of claim 27, wherein said light-emitting portion of said lens portion comprises a substantially spherical end surface portion thereof.

31. The light-emitting diode of claim 24, wherein said light-emitting element is mounted on one of a lead frame, a stem and a substrate.

32. The light-emitting diode of claim 24, wherein said light-emitting element is mounted to a lead frame, and is electrically connected to a second lead frame, said lead frames comprising said means for coupling said light-emitting element to a source of electrical power.

33. The light-emitting diode of claim 24, wherein said light-emitting element is mounted on a substantially flat surface portion in said light-emitting diode.

34. The light-emitting diode of claim 24, wherein said parallel-light fetching means extends from the vicinity of said light-emitting element to said illumination output portion of said light-emitting diode.

35. The light-emitting diode of claim 34, wherein said parallel-light fetching means is longer than said lens portion in the longitudinal direction of said light-emitting diode.

* * * * *